(12) United States Patent
Ueno

(10) Patent No.: US 6,746,726 B2
(45) Date of Patent: Jun. 8, 2004

(54) METHOD FOR FORMING FILM

(75) Inventor: Tomo Ueno, Chuo-ku (JP)

(73) Assignee: Tokyo University of Agriculture & Technology (JP)

( * ) Notice: Subject to any disclaimer, the term of this patent is extended or adjusted under 35 U.S.C. 154(b) by 4 days.

(21) Appl. No.: 09/646,988

(22) PCT Filed: Mar. 23, 1999

(86) PCT No.: PCT/JP99/01429

§ 371 (c)(1),
(2), (4) Date: Nov. 16, 2000

(87) PCT Pub. No.: WO99/50899

PCT Pub. Date: Oct. 7, 1999

(65) Prior Publication Data

US 2003/0003243 A1 Jan. 2, 2003

(30) Foreign Application Priority Data

Mar. 27, 1998 (JP) .......................................... 10/122661

(51) Int. Cl.[7] ................................................. H05H 1/24
(52) U.S. Cl. ....................................... 427/578; 427/579
(58) Field of Search ................................ 427/574, 578, 427/579

(56) References Cited

U.S. PATENT DOCUMENTS

| | | | | | |
|---|---|---|---|---|---|
| 4,532,199 A | * | 7/1985 | Ueno et al. | .................. | 427/575 |
| 4,737,379 A | * | 4/1988 | Hudgens et al. | ............ | 427/579 |
| 4,883,688 A | * | 11/1989 | Houts et al. | ................. | 427/573 |
| 5,037,666 A | * | 8/1991 | Mori | ........................... | 427/575 |
| 5,284,789 A | | 2/1994 | Mori et al. | | |
| 5,310,426 A | * | 5/1994 | Mori | ........................... | 118/723 |
| 5,403,630 A | * | 4/1995 | Matsui et al. | ............... | 427/595 |
| 5,571,576 A | * | 11/1996 | Qian et al. | ................... | 427/579 |
| 6,015,759 A | * | 1/2000 | Khan et al. | ................. | 438/707 |
| 6,183,816 B1 | * | 2/2001 | Yamazaki et al. | ........... | 427/577 |

FOREIGN PATENT DOCUMENTS

| | | |
|---|---|---|
| EP | 0 709 879 A1 | 5/1998 |
| JP | 56-116869 | 9/1981 |
| JP | 63-206461 | 8/1988 |
| JP | 05-217922 | 8/1993 |
| JP | 7-29898 | * 1/1995 |
| JP | 9-64176 | 3/1997 |
| JP | 10-242142 | 9/1998 |

* cited by examiner

Primary Examiner—Bret Chen
(74) Attorney, Agent, or Firm—Parkhurst & Wendel, L.L.P.

(57) ABSTRACT

In a film-forming process of depositing gaseous molecules each composed of plural atoms onto a substrate or reacting the gaseous molecules with the constituting elements of the substrate to form a compound film onto the substrate, the plasma, having excited inert gaseous molecules with higher metastable excited states than the ones required to dissociate the gaseous molecules into their elements and the gaseous molecules, is generated and then, the gaseous molecules are dissociated into their elements before being deposited into the substrate. As a result, dissociation of the gaseous molecules onto the substrate is not required, leading to lowering the temperature of the film-forming process.

10 Claims, 7 Drawing Sheets

METHOD FORMING FILM

TECHNICAL FIELD

This invention relates a method for forming a film.

BACKGROUND ART

A film-forming technique plays an important part in development of a material and a device. In the recent very large integration taking advantage of a microfabrication technique, it is desired to establish a new film-forming technique particularly in an electronic device such as a ULSI. Up to now, the CVD methods, in which all the constituting elements of a film to be formed on a substrate are supplied from an external atmosphere or the thermal oxidizing method in which elements from an external atmosphere are reacted with constituting elements of a substrate to form a film, have been mainly used. In both of the above methods, now, the elements from the external atmosphere are introduced into a vacuum vessel in molecularity.

The recent miniaturization of an elemental device restricts its film-forming process, particularly requiring to lower its processing temperature. One of the factors to make higher the processing temperature is that the constituting elements from the external atmosphere are supplied in molecularity. That is, a part of atoms constituting the molecular elements to be supplied or dissociated atomicity elements from the molecular elements are essentially required in the film-forming process. The conventional film-forming technique dissociates the supplied molecular elements near a heated substrate, so requiring the energy of the dissociation for the temperature of the heated substrate for. Therefore, it has its limit by itself in lowering of the film-forming process.

In the above film-forming technique of supplying the constituting elements from the external atmosphere and depositing the elements on the substrate, for lowering the processing temperature, a sputtering method or a plasma CVD method, in which a given plasma is employed, is suggested and practically used in a part of the film-forming process. The former method etched a solid target by using a plasma energy and deposits the etched particles on a given substrate and the latter method dissociates raw material gas to be supplied and deposits the dissociated elements on a given substrate. These methods are prevailing in solving the above problem, in the view of supplying in advance dissociated elements from the raw material gas onto the given substrate.

On the other hand, a thermal oxidizing process of a silicon substrate, which is typical in the above method of reacting the elements supplied from the external atmosphere with the constituting elements of the substrate, have been widely used in the forming process of gate oxide films of MOSFETs. In the thermal oxidizing process, the gate insulating films having good qualities can be easily formed by heating and holding the silicon substrate at 800° C. and over under an oxidizing atmosphere (oxygen molecule-atmosphere). The obtained silicon oxide film is generally called as a "thermally oxidized film". The above method is described in "J.Appl.Phys", p3770, No. 36 (1965), by B. E. Deal and A. S. Grove, and "Quick Reference Manual for Silicon Integrated Circuit Technology" by W. E. Beadle, J. C. C Tsai and R. D. Plummer, published by "John Wiley & Sons Co. (1985), etc. The main reason of using the high temperature and the large excited energy process is that the silicon oxide film/silicon substrate-boundary surface exhibits good electric characteristics.

Although many methods to form the silicon oxide film on the silicon substrate at a low temperature such as the sputtering method or the plasma CVD method as a directly depositing method, are made an attempt, generally, they shows extremely low boundary face-level density (Dit) which is a typical reference mark for the boundary face characteristic. The reason is that the dangling bonds near the silicon substrate surface, which directly influence the Dit, remain after the silicon oxide film/silicon substrate-boundary face is formed. The part of the dangling bonds may be terminated by hydrogen atoms in a CVD method, but the silicon atom/lydrogen atom-bonds are often cut easily at the ensuing process requiring a temperature of about 400° C. Accordingly, the low temperature-forming method of the silicon oxide film lacks a long-term reliability and has trouble with being applied to forming gate oxide films of LSIs.

Moreover, the method of directly introducing elements dissociated in a plasma atmosphere from an external atmosphere and reacting the dissociated elements with the constituting atomic elements of a substrate is made an attempt to lower the processing temperature. However, it is known, when many molecules each composed of plural atoms are introduced in a plasma, the plasma has an extreme wide energy distribution and thus, the molecules are transformed into a variety of activated species including molecular ions. The thus obtained film does not have its good quality, so that the above method is almost never employed in forming the gate oxide films of MOSFETs requiring harsh conditions.

In addition to the silicon oxide material, a silicon nitride material may be used for the gate oxide film or a passivative film which is insulating film. The silicon nitride film is formed by a variety of methods as in the silicon oxide film. In the case of forming the gate oxide film of the silicon nitride, since the film undesirably has many boundary face-level at its silicon/silicon nitride-boundary face, the film is generally formed so as to have a silicon/silicon oxide/silicon nitride-boundary face.

Recently, a successive process in forming an elemental device requires low temperature process intensely. To comply with the request, the lowering technique of the processing temperature is desired in the whole film-forming process.

In these years, the miniaturization of the MOSFETs and the lowering of the voltage of a driving power supply reach their limits, so that the conventional thermally oxidized film can not give the MOSFETs sufficient qualities. One of the reasons occurs from the high temperature thermal treatment at 800° C. for several ten minutes. That is, when the miniaturization requires to control the impurity-profiles of the MOSFET semiconductor precisely within their shallow profiles, the high temperature thermal treatment destroys the precise shallow impurity-profiles. As mentioned above, the CVD method or the sputtering method not requiring the high temperature thermal treatment degrades the insulating characteristics and the boundary face-qualities because of many dangling bonds. As a result, the miniaturization of the MOSFETs can not tolerate the high temperature thermal treatment, so that the insulating film having good qualities can not be obtained.

Besides, there is a problem due to the environmental change around the MOSFETs. The use of a wafer having a large size for developing productivity has to satisfy the uniformity of the characteristics in all the MOSFETs entirely on the wafer surface. In the case of forming oxide films in a large size equipment corresponding to the large size wafer by using the conventional thermally oxidizing method, the relatively large activation energy of about 1.1 eV to oxidize the wafer surface changes the rate of reaction due to the temperature fluctuation during the heating. It means the difficulty in obtaining oxide films having their uniform thickness on the wafer. When complex calculations are carried out by increasing the number of the MOSFET per one chip, the fluctuation of the characteristics in the MOSFETs becomes not tolerated and severe. Therefore, the insulating films having uniform characteristics has to be formed for many MOSFETs on the wafer.

The adoption of the insulating film formed at a low temperature for the gate oxide film requires to reduce its Dit value, but now, the high temperature process is required for maintaining the electric characteristic of the gate oxide film. Although the high temperature—and large activation energy-process have been used for giving preference to the electric characteristics under the conditions of the use of a small size wafer and not proceeded microfabrication, a low temperature—and small activation energy-process is required for more miniaturization and enlarging the wafer size without the electric characteristics.

For realizing the low temperature in the film-forming process, it is conceivable to dissociate the molecular elements constituting the film in atomicity and supply the dissociated elements. On the other hand, the molecular elements, if they have their excited energy states from their ground states as their molecularity states, have their excited states maintaining their molecularity states (molecular excitation-state), their ionized states maintaining their molecularity states (molecular ionization-state) and their dissociated states perfectly in atomicity (atomicity-state). When an energy is supplied to the molecular elements from a plasma, they have the above states by low energy turn. Accordingly, when the molecular elements are excited to the atomicity-state, for example, they necessarily have another low energy state. Moreover, when they have large energy to be excited to the atomicity-state, they are almost never excited to the atomicity-state.

DESCRIPTION OF THE INVENTION

According to the dissociating method of the molecular elements to the atomicity elements, inert gas molecules absorb an plasma energy in advance and have their large quasi-stable level energies, thereafter, giving their energies to the molecular elements, so that the molecular elements are directly excited to a higher energy states and are easily dissociated to the atomicity elements.

In the case of producing atomicity oxygen elements by dissociating the oxygen molecules with a supplied energy, the oxygen molecules has the states of $O^3P$, $O^1D$, $O^3S$ and so on by low energy turn. Since the oxygen molecules at each state has different activation degree, respectively, if adopted for various oxidizing reaction, it is expected that the molecules exhibits different oxidizing velocity and mechanism. If the inert gas molecules having the various quasi-stable state energies collide with the oxygen molecules to generate a plasma, the kind of the atomicity oxygen elements to be generated in the plasma may be controlled.

For dissociating the molecular elements to the atomicity elements, the inert gas molecules, not the molecular elements, absorb the plasma energy, and thereby, the useless excitations of the molecular elements are suppressed. Thus, the inert gas is introduced by the amount equal to or more than that of the molecular elements and thereby, the atomicity elements are effectively produced from the molecular elements.

In a method for forming an insulating film of the present invention, molecular silicon compound elements constituting the insulating film are introduced on a substrate surface in atomicity. The atomicity is carried out by the emission energies of the inert gas molecules absorbing the plasma energy higher than the energy required in the atomicity. Accordingly, the molecular elements are directly excited to the atomicity-state beyond the molecular excitation-state and the molecular ionization-state. The silicon substrate is oxidized as the molecular elements are oxygen molecules and is nitrided as the molecular elements are nitrogen molecules. The reactions have low activation energies, so that they are easily performed on the silicon substrate surface, not depending on the difference in their reaction temperatures on the substrate. Moreover, since the reactions cut the silicon-silicon bonds and generate the silicon-oxygen bonds or the silicon-nitrogen bonds repeatedly, the thus obtained insulating film/silicon substrate-boundary face has little dangling bonds and low boundary face-level density and thus, the insulating film having excellent insulating characteristics can be formed on the silicon substrate. Consequently, the insulating film having excellent uniform characteristics can be formed on the silicon substrate at a low temperature.

BRIEF DESCRIPTION OF THE DRAWINGS

For better understanding of the present invention, reference is made to the attached drawings, wherein.

BEST MODE FOR CARRYING OUT THE PRESENT INVENTION

[A Preferred First Embodiment in the Present Invention]

The invention will be described in detail hereinafter, with reference to the attaching drawings.

Figure 1:
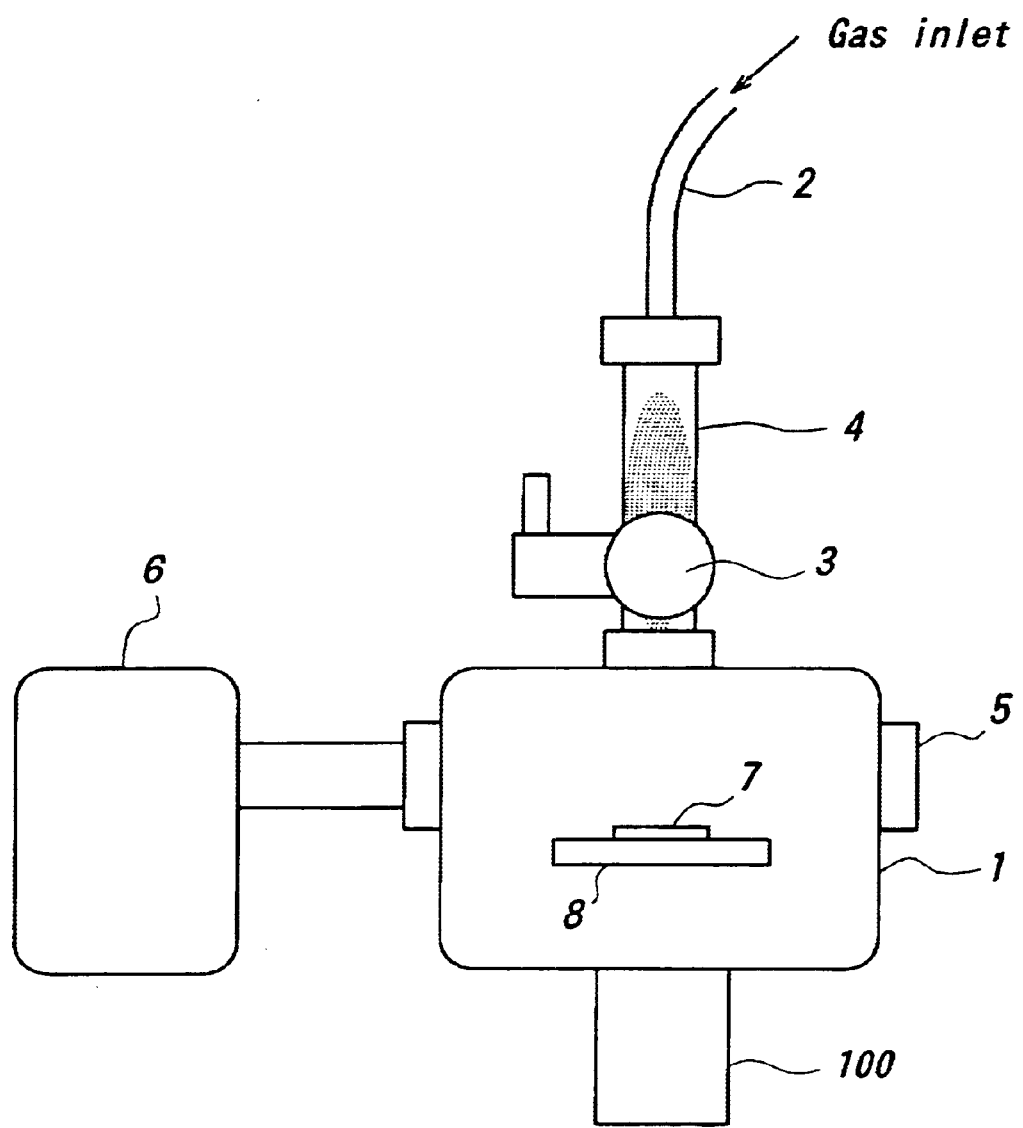
FIG. 1 is a structural view of a film-forming equipment in dissociating one kind of molecular elements into their atomicity elements.

FIG. 1 is a structural view of a film-forming equipment in this preferred embodiment. In this embodiment, by using atomicity hydrogen elements generated from the plasma composed of a mixed gas of helium gas and hydrogen gas, a platinum (Pt) film containing a high concentration hydrogen elements is formed on a platinum substrate. In FIG. 1, numeral "1" depicts a vacuum vessel. Into the vacuum vessel 1 are introduced a mixed gas composed of hydrogen gas and helium gas through a flexible tube 2. The mixed gas is excited to a plasma state in a quartz tube 4 with a microwave cavity 3. The quartz tube 4 with the microwave cavity 3 may be attached at a flange 5 in the right hand of the vacuum vessel 1. A spectroscope 6 attached to the opposite side to the flange 5 of the vacuum tube 1 can analyze the light emission in the plasma. A platinum plate as a substrate 7 is set and fixed onto a heating holder 8 in the vacuum vessel 1.

First of all, the interior of the vacuum vessel 1 is evacuated to a pressure of $1 \times 10^{-5}$ Torr and below by a pump 100. Then, by heating the heating holder 1, the substrate 7 is heated to 300° C. The mixed gas of the helium gas and the hydrogen gas is introduced into the vacuum vessel 1 through the quartz tube 4 to a pressure of 1 Torr. The mix ratio of the helium gas and the hydrogen gas is 1:1. Subsequently, the microwave of 2.45 GHz and 100 W is introduced into the quartz tube 4 through the microwave cavity 3. The thus generated atomicity hydrogen elements are supplied to the platinum substrate to form a platinum film containing a high concentration hydrogen elements on the platinum substrate.

Figure 2:
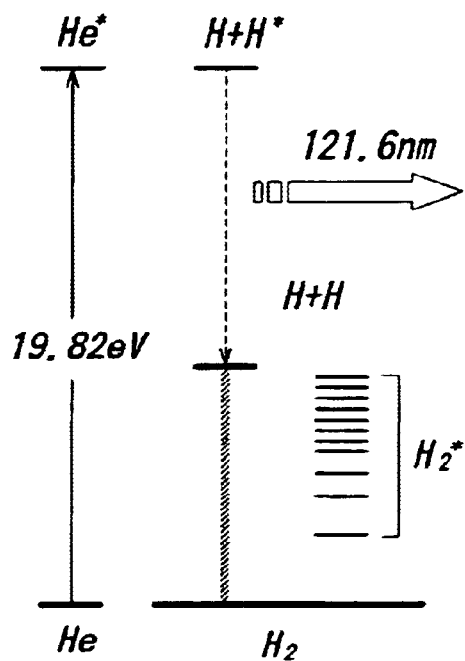
FIG. 2 is a view for explaining the energy states and the light emission due to the state-transitions of helium molecule (He) and hydrogen molecular element ($H_2$)

The above film-forming process will be explained in detail, hereinafter. FIG. 2 is a view explaining the process in which the plasma energy is consumed for the atomicity of the hydrogen molecular elements. In FIG. 2, the excited level of the helium gaseous molecule is higher than the ground level thereof by 19.82 eV. On the other hand, the hydrogen molecular elements get the energy of about 19 eV to dissociate themselves in their atomicity-elements. The dissociated atomicity hydrogen elements having their excited states emit vacuum ultraviolet rays of 121.6 nm to be atomicity hydrogen elements having their ground states. In the case that the plasma has the helium gas molecules by the number equal to or more than the hydrogen molecular elements, as in this embodiment, the hydrogen molecular elements get the energies from the excited helium gas molecules to dissociate themselves into atomicity hydrogen elements. However, in the case that the plasma has only hydrogen molecular elements, the elements are directly excited and the atomicity hydrogen elements are almost never generated.

Figure 3:
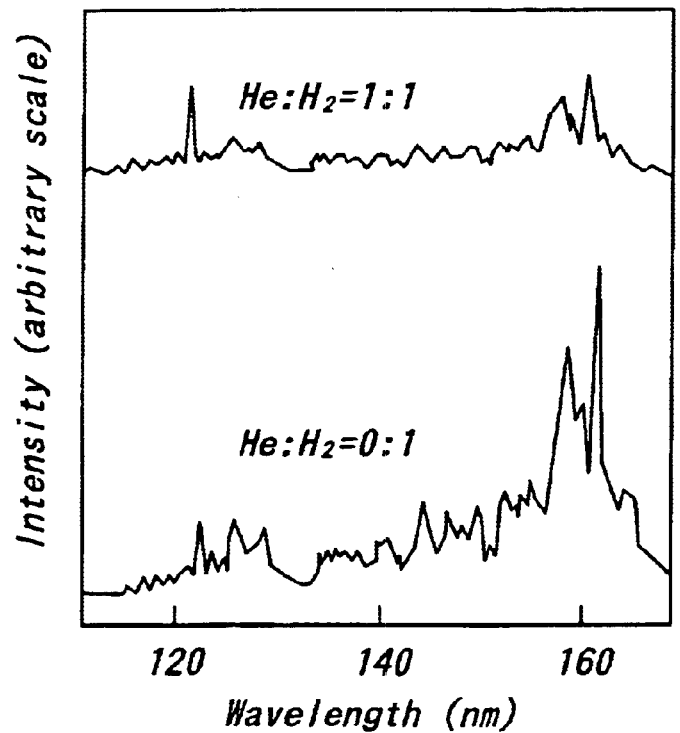
FIG. 3 is a view showing the emission spectrum of the hydrogen molecular elements when the helium gaseous molecules are introduced.

FIG. 3 shows the state in which the atomicity hydrogen elements are effectively generated from the plasma of the mixed gas of the helium gas and the hydrogen gas. In FIG. 3, the emission spectra are measured by the spectroscope 6. Compared with the emission spectrum of the plasma having only the hydrogen molecular elements, the emission spectrum has a large peak at a wavelength of 121.6 nm and a small peak around a wavelength of 160 nm which exhibits the molecular state-excitation of the hydrogen molecular element.

[A Preferred Second Embodiment in the Present Invention]

Figure 4:
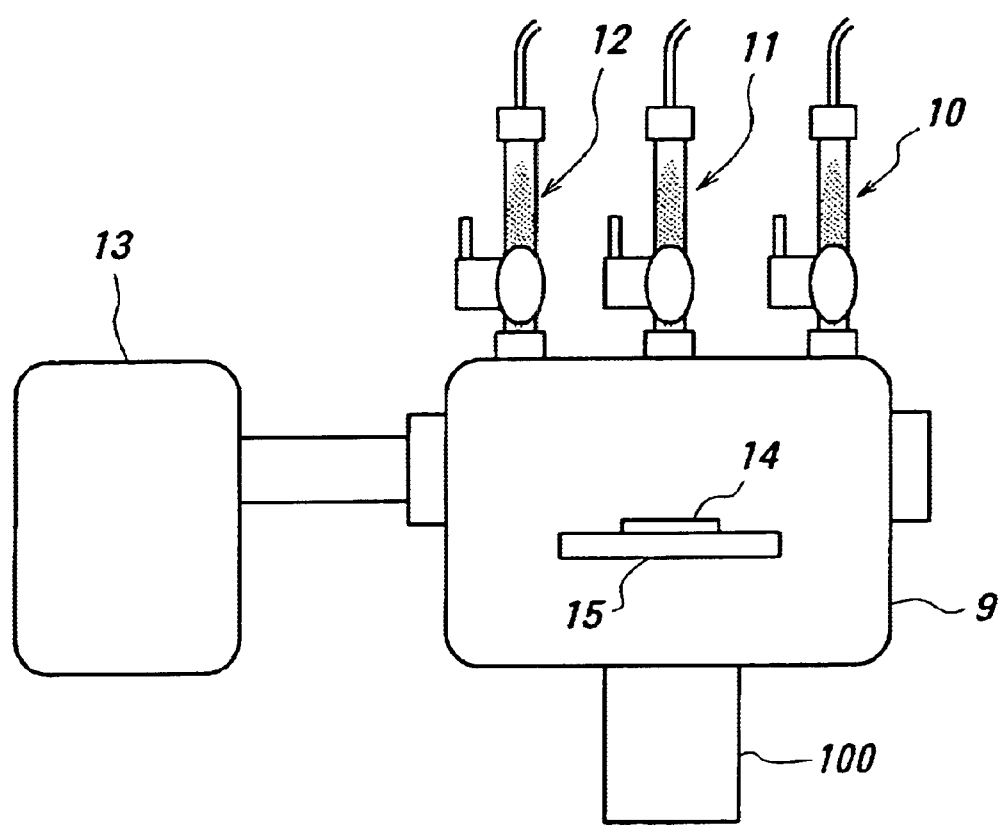
FIG. 4 is a structural view of a film-forming equipment in dissociating three kinds of molecular elements into their atomicity elements.

The forming method of an insulating film according to the present invention will be described, with reference to FIG. 4. Herein, the similar parts in FIG. 4 to ones in FIG. 1 are designated by the same numerals. In this embodiment, a film made of a SiOF low dielectric constant material is formed for passivating aluminum (Al) wires on an insulating film. In FIG. 4, numeral "9" designates a vacuum vessel. Plasma-generating apparatuses 10, 11, and 12 are attached to the vacuum vessel 9, each apparatus having a flexible tube 2, a microwave cavity 3 and a quartz tube 4 which are combined. Then, as in FIG. 1, a spectroscope 13, a substrate 14 and a heating holder 15 are provided.

First of all, the vacuum vessel 9 is evacuated to a pressure of $1 \times 10^{-4}$ Torr and below by a pump 100. And by heating the heating holder 15 to 200° C., the substrate 14 is heated. The substrate has exposed aluminum wires by patterning an insulating film over the wires. A mixed gas of silane ($SiH_4$) gas and argon (Ar) gas, a mixed gas of oxygen ($O_2$) gas and xenon (Xe) gas and a mixed gas of fluorine ($F_2$) gas and krypton (Kr) gas are introduced into the plasma-generating apparatuses 10, 11 and 12, respectively. Then, the microwaves of 2.45 MHz and 100 W are introduced into the plasma-generating apparatuses to generate plasmas composed of the above mixed gases therein. The thus obtained atomicity silicon elements, atomicity oxygen elements and atomicity fluorine elements are supplied onto the substrate to form a SiOF film having a low dielectric constant. The composition of the SiOF film can be controlled by adjusting the ratio of the above atomicity elements.

[A Preferred Third Embodiment in the Present Invention]

Figure 5:
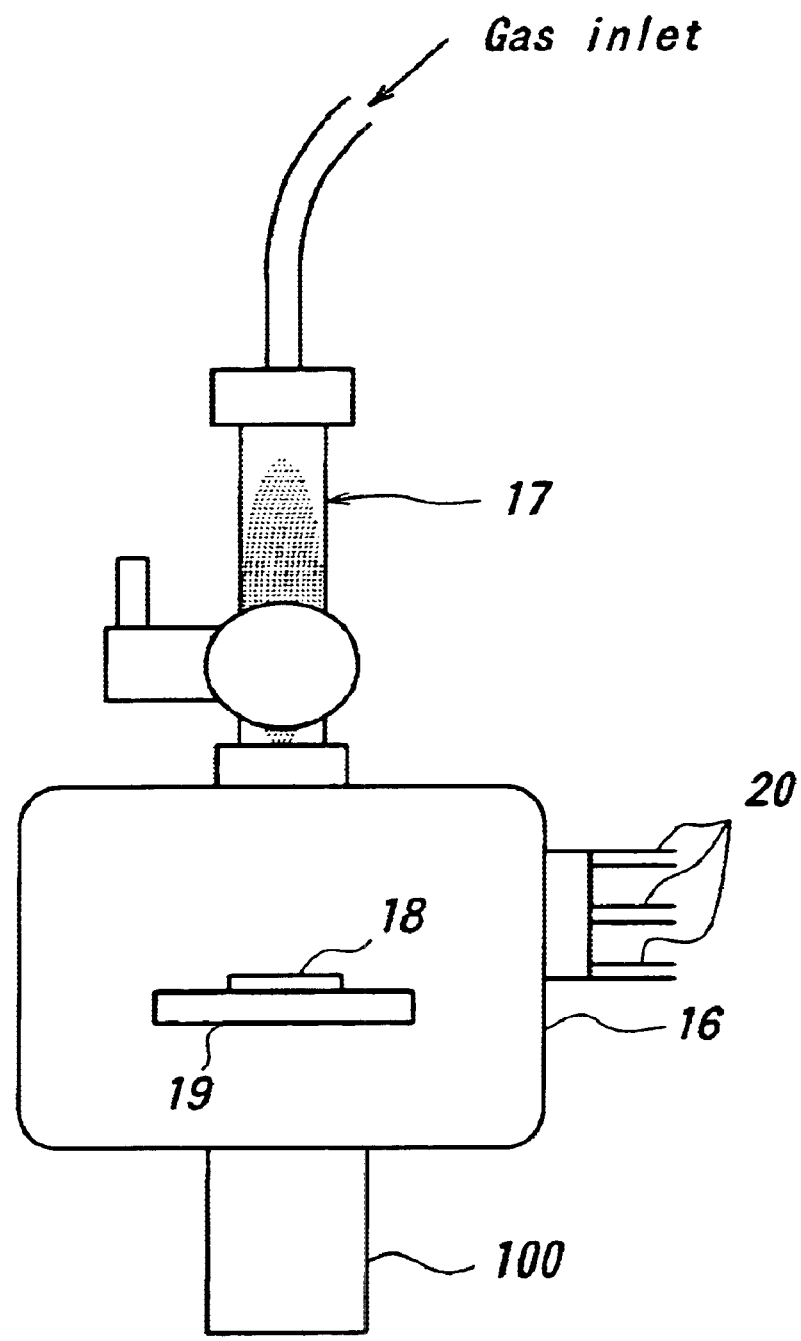
FIG. 5 is a structural view of a film-forming equipment in using three kinds of raw material gases and one kind of atomicity-dissociated molecular elements.

In this embodiment, the forming method of a ferroelectric film according to the present invention will be described hereinafter. FIG. 5 is a film-forming equipment for the ferroelectric film in this embodiment. In this embodiment, a film made of $Pb(Zr,Ti)O_3$ ferroelectric oxide is formed on an underfilm composed of a platinum/magnesium oxide (MgO) stacking structure. In FIG. 5, numeral "16" designates vacuum vessel and numeral "17" designates plasma-generating apparatus. Herein, the similar parts in FIG. 5 to ones in FIG. 1 are designated by the same numerals. A substrate 18 having the platinum/magnesium oxide stacking structure is set onto a heating holder 19 in the vacuum vessel 16. And three gas inlets 20 are provided in the side of the vacuum vessel 16.

The interior of the vacuum vessel 16 is evacuated to a pressure of $1 \times 10^{-5}$ Torr and below by a pump 100. Under the vacuum condition, by heating the heating holder 19, the substrate 18 is heated to 450° C. Into the vacuum vessel 1 from the gas inlets 20 are introduced tetraetliyl lead (TEL:Pb$(C_2H_5)_4$) gas, zirconium tetratertiarybutoxide (BOZ:Zr(t-$OC_4H_9)_4$) gas and titanium tetraisopropoxide (POT:Ti(i-$OC_3H_7)_4$) gas, as raw material gases. Moreover, as an oxidizing gas, a mixed gas of neon (Ne) gas and oxygen gas are introduced into the vacuum vessel 16 through the plasma-generating apparatus 17. The atomicity oxygen elements generated from the plasma composed of the mixed gas and the above raw material gases are reacted in the vacuum vessel 16 to form a $Pb(Zr,Ti)O_3$ film on the substrate 18. Compared with the plasma composed of only the oxygen gas, the plasma composed of the mixed gas improves the oxidization of the film.

[A Preferred Fourth Embodiment in the Present Invention]

Figure 6:
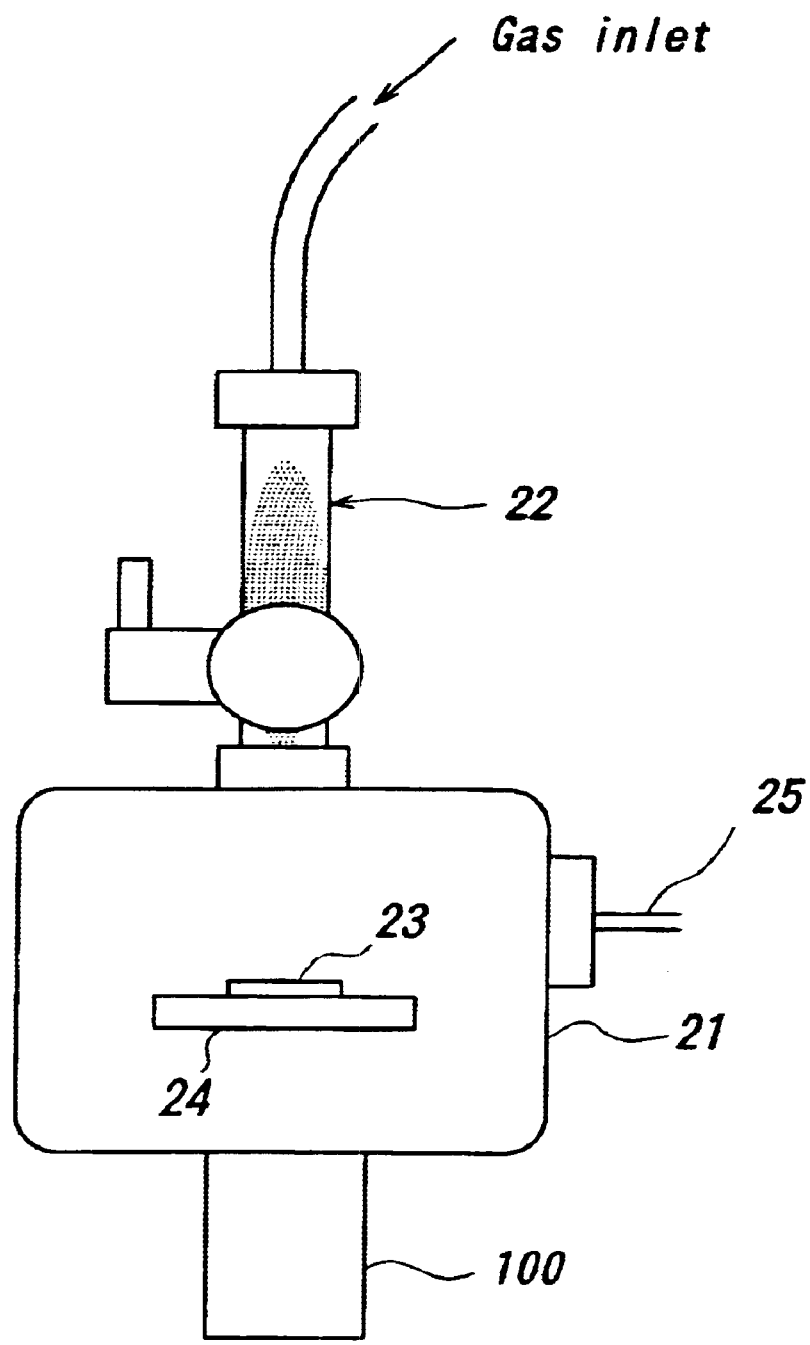
FIG. 6 is a structural view of a film-forming equipment in using one kind of raw material gases and one kind of atomicity-dissociated molecular elements.

In this embodiment, the forming method of a semiconductor compound film will be explained. FIG. 6 shows a film-forming equipment in this embodiment. In this embodiment, a film made of gallium nitride (GaN)is formed on a substrate made of sapphire ($Al_2O_3$). In FIG. 6, numeral "21" designates a vacuum vessel and numeral "22" designates a plasma-generating apparatus. Herein, the similar parts in FIG. 6 to ones in FIG. 1 are designated by the same numerals. The $Al_2O_3$ substrate 23 is set onto a heating holder 24 in the vacuum vessel 21. Moreover, a gas inlet 25 is provided on the vacuum vessel 21.

The interior of the vacuum vessel 21 is evacuated to a pressure of $1 \times 10^{-5}$ Torr and below by a pump 100. Under the vacuum condition, the $Al_2O_3$ substrate 23 is heated through heating the heating holder 24. Then, gallium gas as a raw material gas is introduced from the gas inlet 25. Nitrogen gas as the other raw material gas is mixed with helium gas and the nitrogen molecular elements are excited into atomicity nitrogen elements in the plasma-generating apparatus 22 with the microwave of 2.45 MHz and 100 W. By using the atomicity nitrogen elements generated from the nitrogen molecular elements (which are almost never dissociated), the GaN film and a buffer layer for the film can be formed at a lower temperature than in the past.

[A Preferred Fifth Embodiment in the Present Invention]

In this embodiment, the forming method of an amorphous semiconductor film according to the present invention will be explained. In this embodiment, the same film-forming equipment as the one in the first embodiment is used. In this embodiment, an amorphous silicon film for a solar battery is formed on a transparent electrode film formed on a glass substrate. Thus, in this embodiment, the substrate 7 in FIG. 1 is composed of the glass substrate and the transparent electrode film.

The interior of the vacuum vessel 1 is evacuated to a pressure of $1 \times 10^{-5}$ Torr and below by a pump 100. Under the vacuum condition, by heating the heating holder 8, the substrate 7 having the transparent electrode film/glass substrate stacking structure is heated to 300° C. Silane gas as a raw material gas is diluted with argon gas by five times amount of the silane gas, and is introduced into the vacuum vessel 1 through the quartz tube 4 to a pressure of 1 Torr. The microwave of 2.45 MHz and 100 W is introduced into the quartz tube 4 through the microwave cavity 3 to generate the plasma composed of the silane gas and the argon gas. The argon gaseous molecules absorb almost the plasma energy and thereby, the silane gaseous molecules get the energies (11.6 eV) from the excited state-argon gaseous molecules. Consequently, the silane gaseous molecules are dissociated into the atomicity silicon elements and thereby, the amorphous silicon film having good qualities is formed.

[A Preferred Sixth Embodiment in the Present Invention]

Figure 7:
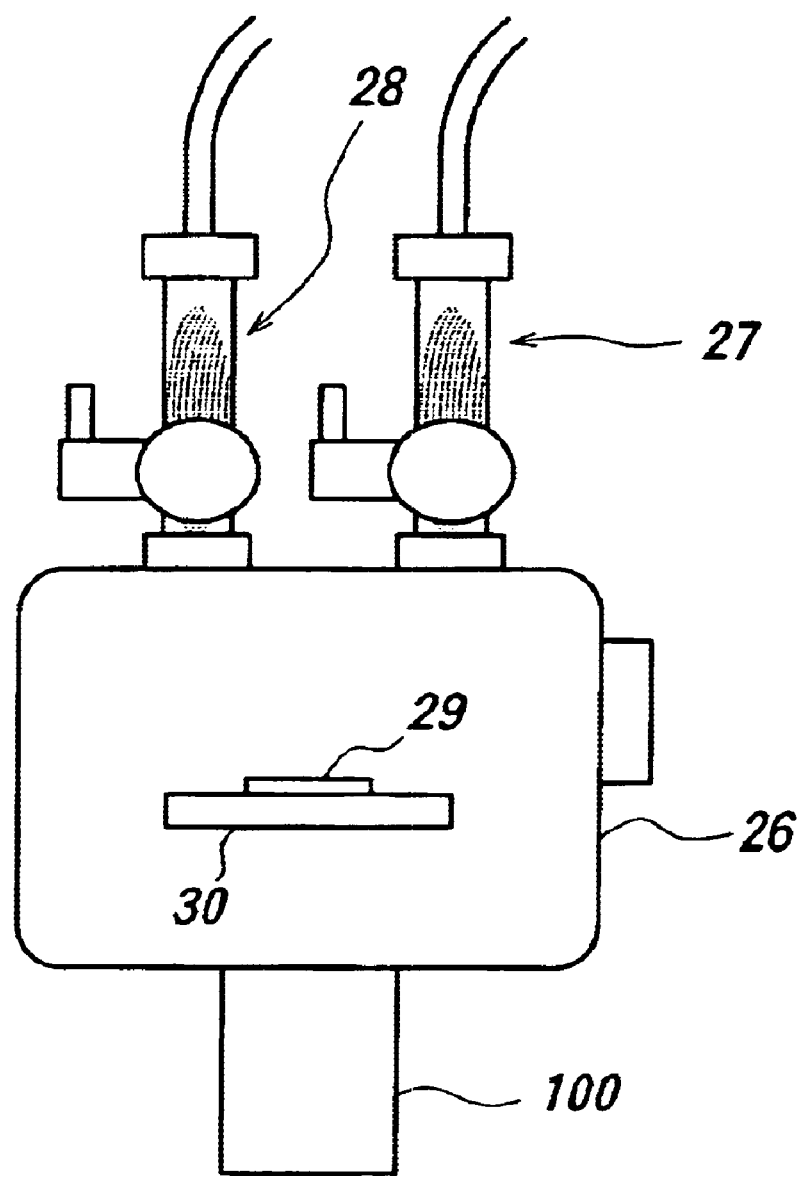
FIG. 7 is a structural view of a film-forming equipment in using two kinds of atomicity-dissociated molecular elements.

In this embodiment, the forming method of a passivation film will be explained. FIG. 7 shows a film-forming equipment in this embodiment. In this embodiment, a film made of silicon oxide ($SiO_2$) is formed for passivating aluminum wires formed on an insulating film. In FIG. 7, numeral "26" designates a vacuum vessel and numerals "27" and "28" designate plasma-generating apparatuses. Herein, the similar parts in FIG. 7 to ones in FIG. 1 are designated by the same numerals. A substrate 29 composed of the insulating film and the patterned aluminum wiring structure formed on the insulating film is set onto a heating holder 30 installed in the vacuum vessel 26.

First of all, the interior of the vacuum vessel 26 is evacuated to a pressure of $1 \times 10^{-5}$ Torr and below by a pump 100. Under the vacuum condition, by heating the heating holder 30, the substrate 29 is heated to 300° C. Then, silane gas is diluted with argon gas by five times amount of the silane gas, and the plasma composed of the silane gas and the argon gas is generated in the plasma-generating apparatus 27. Consequently, as in the fifth embodiment, the silane gaseous molecules are dissociated into the atomicity silicon elements, which are introduced into the vacuum vessel 26. In the same way, oxygen gas is diluted with the krypton gas by the twenty time amount of the oxygen gas and the thus obtained mixed gas is introduced into the plasma-generating apparatus 28. Consequently, the atomicity oxygen elements are generated from the oxygen molecular elements and thereby, the $SiO_2$ film is formed on the substrate 29. Herein, the pressure in the vacuum vessel was 1 Torr. By the same manner, a film made of silicon nitride film can be formed from the atomicity silicon elements and the atomicity nitrogen elements generated from a mixed argon-silane gas and a mixed helium-nitrogen gas.

[A Preferred Seventh Embodiment in the Present Invention]

Figure 8:
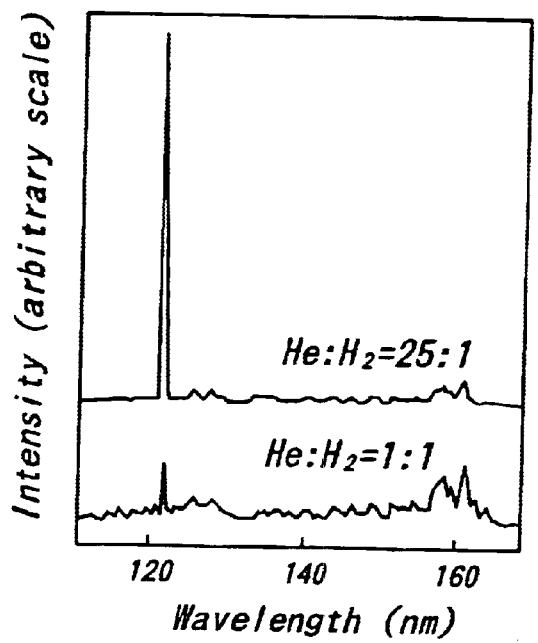
FIG. 8 is a view showing the emission spectrum of the hydrogen molecular elements when the helium gaseous molecules are introduced by the amount equal to or more than the amount of the hydrogen molecular elements.
Figure 9:
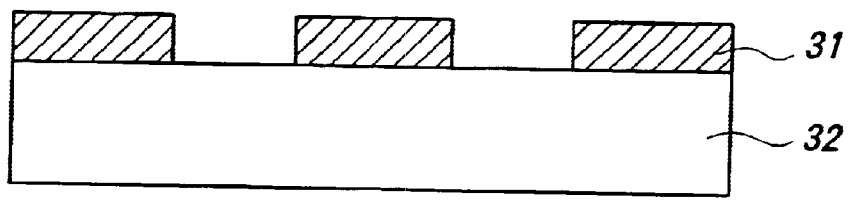
FIG. 9 is a schematic sectional view of a silicon substrate in which the insulating film has openings in the source and drain areas.

In this embodiment, the method of effectively dissociating molecular elements into their atomicity elements will be described. In this embodiment, the same equipment as the one in the first embodiment is used. In this embodiment, hydrogen molecular elements are effectively dissociated into their atomicity hydrogen elements. FIG. 8 shows the emission spectrum of the atomicity hydrogen elements in the plasma composed of a mixed gas of helium gas:hydrogen gas=25:1. Then emission spectrum is measured with the spectroscope 6. Compared with the plasma composed of a mixed gas of helium gas:hydrogen gas=1:1, the plasma composed of the mixed gas of helium gas :hydrogen gas= 25:1, that is, having a larger amount of helium gas than hydrogen gas, exhibits an extremely large peak at a wavelength of 121.6 nm and extremely small peak around a wavelength of 160 nm. The dissociating method in this embodiment can be adopted for the first through fourth embodiments, so the oxygen molecular elements, the fluorine molecular elements and the nitrogen molecular elements can be effectively dissociated onto their atomicity elements.

[A Preferred Eighth Embodiment in the Present Invention]

In this embodiment, the method for forming a P-doped silicon area will be explained. In this embodiment, the same equipment as the one in the first embodiment is used. In this embodiment, a silicon substrate having a patterned insulating film with openings in a source area and a drain area is employed as the substrate 7 in the first embodiment.

First of all, the interior of the vacuum vessel 1 is evacuated to a pressure of $1 \times 10^{-5}$ Torr and below by a pump 100. Under the vacuum condition, by heating the heating holder 8, the substrate 7 is heated to 500° C. $P_2O_5$ gas as a P-containing raw material gas is mixed with helium gas and the mixed gas is introduced into the vacuum vessel 1 through the quartz tube 4. The microwave of 2.45 GHz and 100 W is introduced into the quartz tube 4 through the microwave cavity 3 to generate the plasma composed of the mixed gas of $P_2O_5$ gas and helium gas. The helium gaseous molecules absorb almost the energies from the plasma and give the $P_2O_5$ molecular elements their excited energies. Accordingly, the $P_2O_5$ molecular elements are almost dissociated into their atomicity elements and thereby, the P-doped silicon area is formed at the openings of the substrate. Moreover, a boron (B) doped silicon area can be formed by using a mixed gas of $B_2O_3$ gas and neon gas instead of the above mixed gas.

[A Preferred Ninth Embodiment in the Present Invention]

In this embodiment, the forming method of a boron-doped silicon film will be explained. In this embodiment, the same film-forming equipment as the one in the sixth embodiment is used. The substrate 30 is made of silicon material.

First of all, the interior of the vacuum vessel 26 is evacuated to a pressure of $1 \times 10^{-5}$ Torr and below by a pump 100. Under the vacuum condition, by heating the heating holder 30, the substrate 29 is heated to 500° C. Then, $B_2O_3$ gas as a B-containing raw material gas is mixed to neon gas and the mixed gas is introduced into the plasma-generating apparatus 27. Into the plasma-generating apparatus 28 is introduced a mixed gas of argon gas and silane gas. Thereafter, the atomicity boron elements and the atomicity silicon elements are generated from the mixed gases, respectively, and thus, the boron-doped silicon film is formed on the silicon substrate.

[A Preferred Tenth Embodiment in the Present Invention]

In this embodiment, the forming method of a gate oxide film will be explained. In this embodiment, the same film-forming equipment as the one in the first embodiment is used. Moreover, in this embodiment, the substrate 7 is composed of the isolated silicon substrate shown in FIG. 10.

First of all, the interior of the vacuum vessel 1 is evacuated to a pressure of $1 \times 10^{-5}$ Torr and below by a pump 100. Under the vacuum condition, by heating the heating holder 8, the isolated silicon substrate 7 is heated to 500° C. Then, argon gas and oxygen gas are introduced into the vacuum vessel 1 through the quartz tube 4 to a pressure of 1 Torr. In this case, the mixed gas has a ratio of the argon gas: the oxygen gas=25:1 and a flow rate of 100 sccm. The microwave of 2.45 GHz and 100 W is introduced into the quartz tube 4 through the microwave cavity 3 to generate the plasma composed of the mixed gas of the argon gas and the oxygen gas. The much argon molecules absorb almost the energies from the plasma and give the oxygen molecular elements the argon-excited energies. Consequently, the atomicity oxygen elements are generated from the oxygen molecular elements and react with the silicon elements constituting the silicon substrate to form a silicon oxide film at the opening of the silicon substrate 7. In this embodiment, the silicon substrate is oxidized at an oxidizing speed nearly equal to the one in the conventional 800° C.-thermal oxidizing method using oxygen molecular elements.

[A Preferred Eleventh Embodiment in the Present Invention]

Figure 10:
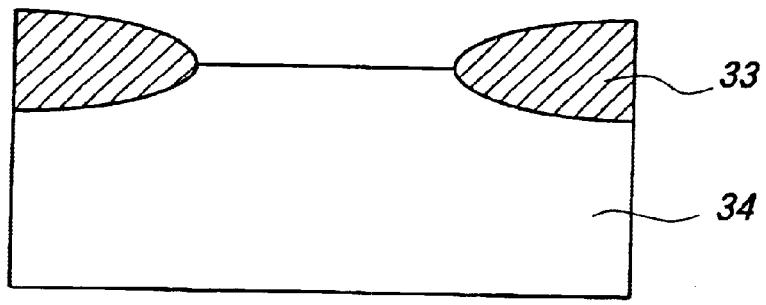
FIG. 10 is a schematic sectional view of an isolated silicon substrate.

In this embodiment, the film-forming method of oxidizing a silicon substrate using krypton elements and oxygen elements will be explained. In this embodiment, the same film-forming equipment as the one in the first embodiment is used. Moreover, in this embodiment, the isolated silicon substrate shown in FIG. 10 is employed as the substrate 7 as in the tenth embodiment.

First of all, the interior of the vacuum vessel 1 is evacuated to a pressure of $1 \times 10^{-5}$ Torr and below by a pump 100. Under the vacuum condition, by heating the heating holder 8, the substrate 7 is heated to 500° C. Then, the mixed gas of krypton gas: oxygen gas=25:1 is introduced at a flow rate of 100 sccm to a pressure of 1 Torr. The microwave of 2.45 GHz and 100 W is introduced into the quartz tube 4 through the microwave cavity 3 to generate the plasma composed of the mixed gas of krypton gas and oxygen gas. The krypton molecules absorb almost the energies from the plasma and give the oxygen molecular elements their excited energies (9.92 eV). Consequently, the oxygen molecular elements are almost dissociated into their atomicity oxygen elements and oxidize the opening of the isolated substrate 7. The thus obtained $SiO_2/Si$ boundary face has a boundary face-level density of $3 \times 10^{11}/cm^2 \cdot eV$ at Dit (mid gap). Moreover, when the activation energy of the oxidizing reaction, which is an index of the diffusion rate controlling in the oxidizing reaction, is measured by varying the substrate temperature to 600° C. from 300° C., it turns out to be about 0.14 eV. It means that the change of the oxidizing velocity to the change of the substrate temperature is extremely small. In this embodiment, the substrate temperature of 400° C. gives the $SiO_2/Si$ boundary face a boundary face-level density of $5 \times 10^{11}/cm^2 \cdot eV$ at Dit (mid gap).

[A Preferred Twelfth Embodiment in the Present Invention]

In this embodiment, the film-forming method of oxidizing a silicon substrate using xenon elements and oxygen elements will be explained. In this embodiment, the same film-forming equipment as the one in the first embodiment is used. Moreover, in this embodiment, the isolated silicon substrate shown in FIG. 10 is employed as the substrate 7 as in the tenth embodiment.

First of all, the interior of the vacuum vessel 1 is evacuated to a pressure of $1 \times 10^{-5}$ Torr and below by a pump 100. Under the vacuum condition, by heating the heating holder 8, the substrate 7 is heated to 500° C. Then, the mixed gas of xenon gas: oxygen gas=25:1 is introduced at a flow rate of 100 sccm to a pressure of 1 Torr. The microwave of 2.45 GHz and 100 W is introduced into the quartz tube 4 through the microwave cavity 3 to generate the plasma composed of the mixed gas of xenon gas and oxygen gas. The thus generated atomicity oxygen elements enable the opening of the isolated silicon substrate 7 to be oxidized. In this embodiment using the plasma composed of the mixed gas of xenon and oxygen, an oxidizing velocity almost equal to that in the conventional 900° C.-thermal oxidizing method can be obtained and the oxidation of the silicon substrate can be realized at a low temperature of 400° C.

[A Preferred Thirteenth Embodiment in the Present Invention]

In this embodiment, the film-forming method of nitriding a silicon substrate using helium elements and nitrogen elements will be explained. In this embodiment, the same film-forming equipment as the one in the first embodiment is used. Moreover, in this embodiment, the isolated silicon substrate shown in FIG. 10 is employed as the substrate 7 as in the tenth embodiment.

First of all, the interior of the vacuum vessel 1 is evacuated to a pressure of $1 \times 10^{-5}$ Torr and below by a pump 100. Under the vacuum condition, by heating the heating holder 8, the substrate 7 is heated to 600° C. Then, the mixed gas of helium gas: nitrogen gas=10:1 is introduced into the vacuum vessel 1 through the quartz tube 4 at a flow rate of 100 sccm to a pressure of 1 Torr. A microwave of 2.45 GHz and 100 W is introduced into the quartz tube 4 through the microwave cavity 3 to generate the plasma composed of the mixed gas of helium gas and nitrogen gas.

The thus generated atomicity nitrogen elements enable the opening of the isolated silicon substrate 7 to be directly nitrided.

[A Preferred Fourteenth Embodiment in the Present Invention]

In this embodiment, the forming method for forming an oxynitride film (SiON film) will be described. In this embodiment, the same film-forming equipment as the one in the sixth embodiment is used. Moreover, in this embodiment, the isolated silicon substrate shown in FIG. 10 is employed as the substrate 7 as in the tenth embodiment.

First of all, the interior of the vacuum vessel 26 is evacuated to a pressure of $1 \times 10^{-5}$ Torr and below by a pump 100. Under the vacuum condition, by heating the heating holder 30, the substrate 29 is heated to 600° C. Then, the mixed gas of krypton gas: oxygen gas=25:1 is introduced into the plasma-generating apparatus 27. And the mixed gas of helium gas: nitrogen gas=10:1 is introduced into the plasma-generating apparatus 28. In this case, the pressure in the vacuum vessel is 1 Torr. The atomicity oxygen elements and the atomicity nitrogen elements, generated in the plasma-generating apparatuses, react with the silicon elements constituting the silicon substrate to form the SiON film having a good boundary face quality and a high dielectric constant.

(Industrial Applicability)

According to the present invention, the molecules, each composed of plural atoms, can be effectively dissociated into their atomicity elements, the low temperature film-forming process, using the molecules, can be realized.

What is claimed is:

1. A film-forming method of supplying gaseous molecules, each composed of plural atoms, onto a substrate, said film-forming method comprising:

providing a silicon substrate;

providing a mixture of an inert gas component containing only at least one of a Kr gas end a Xe gas and a gas component containing maid gaseous molecules, the gaseous molecules containing the constituting elements of a silicon compound to be film-formed onto the substrate;

generating a plasma of said mixture, to excite molecules of said inert gas, and thus, to excite said gaseous molecules through the collision between said excited molecules of said inert gas and said gaseous molecules to a quasi-stable level energy required to dissociate said gaseous molecules into their respective elements; and supplying said elements of said gaseous molecules onto said substrate.

2. a film-forming method as defined in claim 1, wherein the gaseous molecules include oxygen molecules.

3. A film-forming method as defined in claim 1, wherein the gaseous molecules include nitrogen molecules.

4. A film-forming method as defined in claim 1, wherein the inert gas has a molecul density not less than that of the gaseous molecules in the mixed gas.

5. A film-forming method as defined in claim 1, wherein at least a part of the silicon elements constituting the silicon compound are dissociated into silicon elements.

6. A film-forming method as defined in claim 1, wherein the silicon compound is a silicon oxide.

7. A film-forming method as defined in claim 6, wherein the inert gas is krypton gas and the gaseous molecules include oxygen molecules to be dissociated into oxygen elements to oxidize the substrate.

8. A film-forming method as defin d in claim 6, wherein the inert gas is xenon gas and the gaseous molecules include oxygen molecules to be dissociated into oxygen elements to oxidize the substrate.

9. A film-forming method as defined in claim 1, wherein the silicon compound is a silicon oxynitride.

10. A film-forming method of supplying gaseous molecule, each composed of plural atoms, onto a substrate, said film-forming method comprising:

providing a substrate;

providing a mixture of an inert gas component containing at least one of a Kr gas and a Xe gas and a gas component containing said gaseous molecules;

generating a plasma of said mixture, to excite molecules of said inert gas, and thus, to excite said gaseous molecules through the collision between said excited molecules of said inert gas and said gaseous molecules to a quasi-stable level energy required to dissociate said gaseous molecules into their respective elements; and supplying said elements of said gaseous molecules onto said substrate, said substrate being a silicon substrate;

said gaseous molecules containing Si elements and nitrogen molecules to be dissociated into their respective elements;

said inert gas component further containing He gas.

* * * * *